United States Patent [19]
Hsia et al.

[11] Patent Number: 5,393,708
[45] Date of Patent: Feb. 28, 1995

[54] INTER-METAL-DIELECTRIC PLANARIZATION PROCESS

[75] Inventors: Shaw-Tzeng Hsia; Kuang-Chao Chen, both of Taipei, Taiwan, Prov. of China

[73] Assignee: Industrial Technology Research Institute, Hsinchu, Taiwan, Prov. of China

[21] Appl. No.: 957,801

[22] Filed: Oct. 8, 1992

[51] Int. Cl.⁶ .............................................. H01L 21/44
[52] U.S. Cl. .................... 437/228; 437/235; 437/238
[58] Field of Search ............... 437/228, 235, 238, 985, 437/982

[56] References Cited

U.S. PATENT DOCUMENTS

| | | | |
|---|---|---|---|
| 4,872,947 | 10/1989 | Wang et al. | 156/643 |
| 4,885,262 | 12/1989 | Ting et al. | 437/982 |
| 5,266,525 | 11/1993 | Morozumi | 437/195 |

OTHER PUBLICATIONS

Kawai, M., et al. "Interlayered Dielectric Planarization with TEOS-CVE and SOG", Proc. IV Intern'tl IEEE VLSI Conf. (1988) pp. 419–425.

Lee, J. G., et al. "SACVD: A New Approach for 16 Mb Dielectrics," Semicond. International, May 1992, pp. 116–120.

Primary Examiner—Olik Chaudhuri
Assistant Examiner—C. Everhart
Attorney, Agent, or Firm—George O. Saile

[57] ABSTRACT

A new method of planarizing an integrated circuit is achieved. The dielectric layers between the conductive layers of an integrated circuit are formed and planarized via combining TEOS with ozone silicon oxide pyrolytic deposition with plasma-enhanced deposition processes and spin-on-glass processes. A first insulator layer is provided over the conductive layer by plasma-enhanced chemical vapor deposition (PECVD). This insulator layer is covered with a layer of TEOS with ozone deposited silicon oxide by pyrolytic chemical vapor deposition (THCVD). The TEOS with ozone silicon oxide layer will fill the irregular trenches and holes in the conductive layer structure not filled by the first insulator layer. The TEOS with ozone layer is anisotropically etched back leaving the TEOS with ozone layer only in the trenches and holes of the layer structure. A second insulating layer is deposited by PECVD and then is covered by at least one spin-on-glass layer to fill the wider valleys of the irregular structure. The spin-on-glass layer is cured, then partially blanket anisotropically etched through its thickness to the underlying second oxide layer at its highest points and leaving the spin-on-glass layer portions in the valleys. A top dielectric layer is deposited over the spin-on-glass layer to complete the planarization.

20 Claims, 4 Drawing Sheets

INTER-METAL-DIELECTRIC PLANARIZATION PROCESS

BACKGROUND OF THE INVENTION (1) Field of the Invention

The invention relates to a method of planarizing an integrated circuit device, and more particularly, to a method of planarizing a submicron integrated circuit device by integrating a plasma-enhanced silicon oxide deposition, a TEOS with ozone silicon oxide deposition and a spin-on-glass deposition process.

(2) Description of the Prior Art

In conventional planarization of the metallurgy-dielectric layers of an integrated circuit, a metal is deposited and patterned by conventional lithography and etching techniques. Then the intermetal dielectric layer, which is typically silicon oxide material, is formed thereover. The dielectric layer may now be etched back to planarize the metallurgy-dielectric layers. There are basic problems in planarizing the metallurgy-dielectric layers wherein there are both wide spaces, greater than 0.6 microns, and narrow spaces, less than 0.6 microns. Conventional planarization methods have difficulty filling all spaces satisfactorily.

A number of patents have addressed these and other problems in planarization. U.S. Pat. No. 5,250,472 to K. C. Chen and S. T. Hsia describes an integration of a partial etchback siloxane spin-on-glass process with a silicate spin-on-glass process. U.S. Pat. No. 4,962,063 to Maydan et al involves a plasma deposition followed by flowing of a low melting point glass to provide a planarized surface. In their paper, "SACVD: A New Approach for 16Mb Dielectrics"(J. G. Lee, S. H. Choi, T. C. Ahn, C. G. Hong, P. Lee, K. Law, M. Galiano, P. Keswick, and B. Shin, *Semiconductor International*, May 1992, pp. 116–120), the authors discuss the use of sub-atmospheric chemical vapor deposition of TEOS-ozone undoped silicate glass and borophosphosilicate glass.

SUMMARY OF THE INVENTION

A principal object of the present invention is to provide an effective and very manufacturable method of planarizing a submicron integrated circuit which incorporates a TEOS with ozone silicon oxide deposition process with spin-on glass processing.

Another object of the present invention is to provide a method of planarizing an integrated circuit which will fill smaller openings than the standard process.

Another object of the present invention is to provide a method of planarizing an integrated circuit which does not result in the metallurgy problem of poisoned via.

Yet another object of the present invention is to provide a method of planarizing an integrated circuit which does not result in voids between devices.

In accordance with the objects of this invention a new method of planarizing an integrated circuit is achieved. The dielectric layers between the conductive layers of an integrated circuit are formed and planarized via combining TEOS with ozone silicon oxide pyrolytic deposition with plasma-enhanced deposition processes and spin-on-glass processes. A first insulator layer is provided over the conductive layer by plasma-enhanced chemical vapor deposition (PECVD). This insulator layer is covered with a layer of TEOS with ozone deposited silicon oxide by pyrolytic chemical vapor deposition (THCVD). The TEOS with ozone silicon oxide layer will fill the irregular trenches and holes in the conductive layer structure not filled by the first insulator layer. The TEOS with ozone layer is anisotropically etched back leaving the TEOS with ozone layer only in the trenches and holes of the layer structure. A second insulating layer is deposited by PECVD and then is covered by at least one spin-on-glass layer to fill the wider valleys of the irregular structure. The spin-on-glass layer is cured, then partially blanket anisotropically etched through its thickness to the underlying second oxide layer at its highest points and leaving the spin-on-glass layer portions in the valleys. A top dielectric layer is deposited over the spin-on-glass layer to complete the planarization.

BRIEF DESCRIPTION OF THE DRAWINGS

In the accompanying drawings forming a material part of this description, there is shown.

DESCRIPTION OF THE PREFERRED EMBODIMENTS

Figure 1:
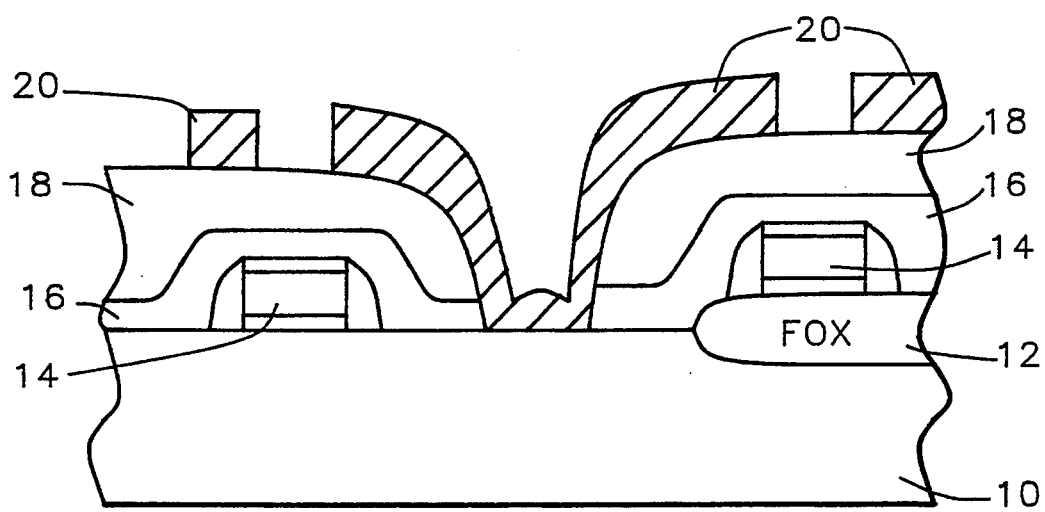
FIGS. 1 through 8 schematically illustrate in cross-sectional representation one preferred embodiment of this invention.

Referring now more particularly to FIG. 1, there is shown a portion of a partially completed integrated circuit after patterning of the first metal layer 20. The semiconductor substrate 10 is preferably composed of monocrystalline silicon. Field oxide regions 12 have been formed in the semiconductor substrate 10. Gate electrode patterns 1 have been formed as is conventional in the art over the gate dielectric on the silicon substrate and overlying the FOX regions 12. A passivation or insulating layer is then formed over the surfaces of the patterns. This layer may be composed of multilayers such as a thin layer of silicon oxide 16 and a much thicker layer of borophosphosilicate glass, phosphosilicate glass or similar insulating layer 18. The operational thicknesses of these layers are between about 500 to 2000 Angstroms for the silicon oxide layer and between about 3000 to 8000 Angstroms for the glasseous layer. These layers are typically deposited by low pressure chemical vapor deposition (LPCVD) or atmospheric pressure chemical vapor deposition (APCVD).

Contact openings are formed through the insulating structure to the semiconductor substrate 10. Conventional lithography and etchings techniques are used to form this pattern of openings.

The first metallurgy contact layer 20 is now deposited over the surface of the structure and within the pattern of via openings. The metallurgy is preferably Ti/TiN/AlSiCu having a thickness of between about 5000 to 8000 Angstroms. However, other possible metallurgy include Ti/AlSiCu, Ti/TiW/AlSiCu, Ti/AlSiCu/TiN, and Ti/TiW/AlSiCu/TiN. The metallurgy may be deposited by a metal sputtering method. The metallurgy is now patterned into the desired conductive lines by conventional lithography and etching techniques to form the pattern of metal layer 20 in FIG. 1.

Figure 2:
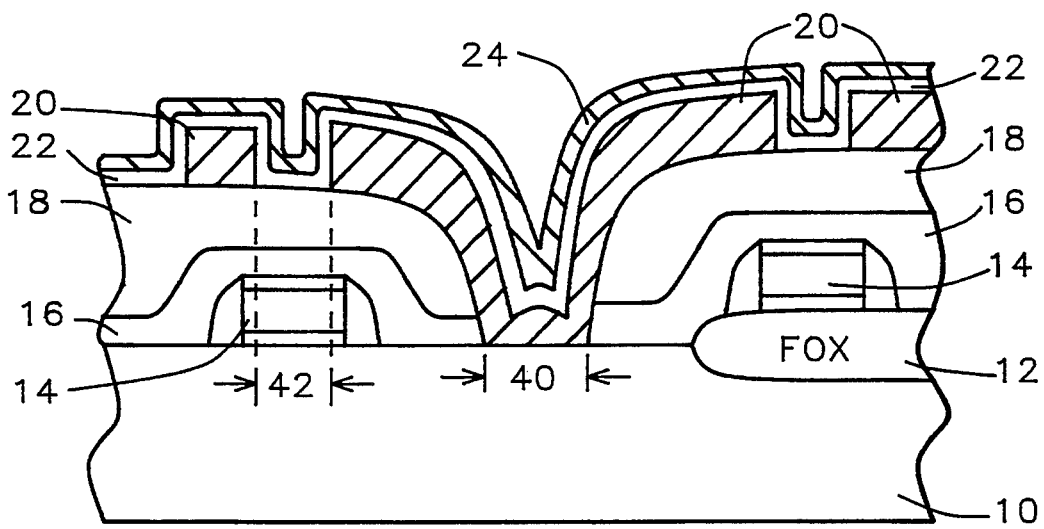

Referring now to FIG. 2, there is shown the first silicon oxide insulator layer 22 of the inter-metal dielectric. Other insulating layer materials can also be used. This silicon oxide layer can be formed using TEOS and $O_2$ plasma-enhanced chemical vapor deposition (PECVD) under the vacuum conditions of between about 8 to 10 Torr and preferably 9 Torr, at a wafer susceptor temperature of between about 380° to 400° C.

and preferably 390°C., in a plasma environment to a preferred thickness of between about 1500 to 2500 Angstroms.

The next step is the chemical vapor deposition (THCVD) of silicon oxide using TEOS with ozone ($O_3$) gas under the conditions of vacuum between about 55 to 65 Torr and preferably about 60 Torr, and wafer susceptor temperature of between about 380° to 400° C. and preferably about 390° C. to a preferred thickness of between about 2000 and 3000 Angstroms. This layer 24 fills the deep trenches and holes that the PECVD TEOS cannot fill. Layer 22 and 24 depositions can be processed, for example, in an Applied Material, Inc. model PR5000 system.

Figure 3:
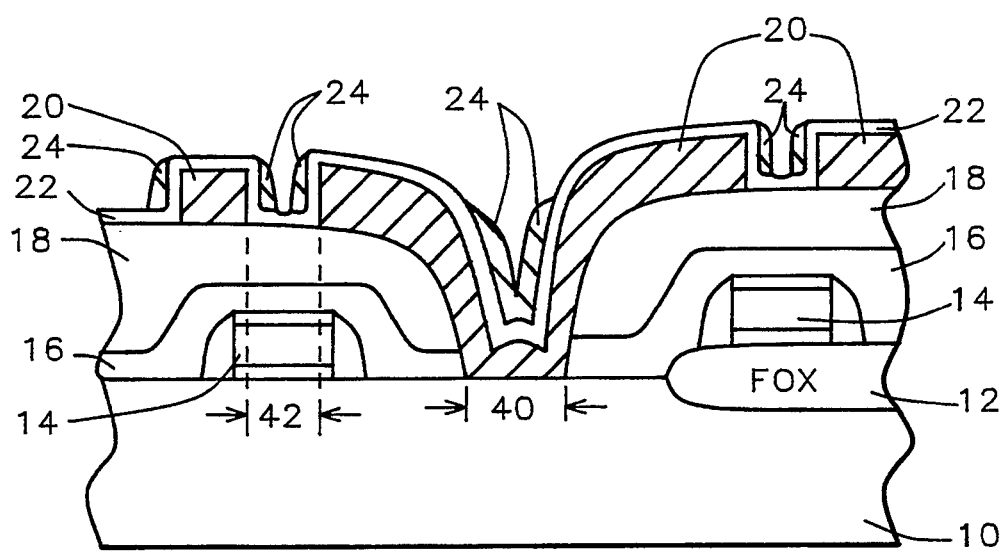

Referring now to FIG. 3, the two oxide layers 22 and 24 are anisotropically etched back preferably with $CF_4$ gas at a pressure of 300 mTorr and power of 360 watts. The etchback is timed to stop based on thickness etched; in this case, to a thickness of between about 2400 to 3400 Angstroms. This will etch away the $O_3$ with TEOS deposited silicon layer leaving it in trenches and holes only. Some of the PECVD silicon oxide layer 22 also is etched away. The selectivity between the PECVD 22 and THCVD 24 layers is greater than about 1.05. Note that the remaining $O_3$ with TEOS silicon oxide layer 24 retains a positive angle as seen in FIG. 3 at the filled openings wherein the next layer can fill these opening without the formation of voids.

Figure 4:
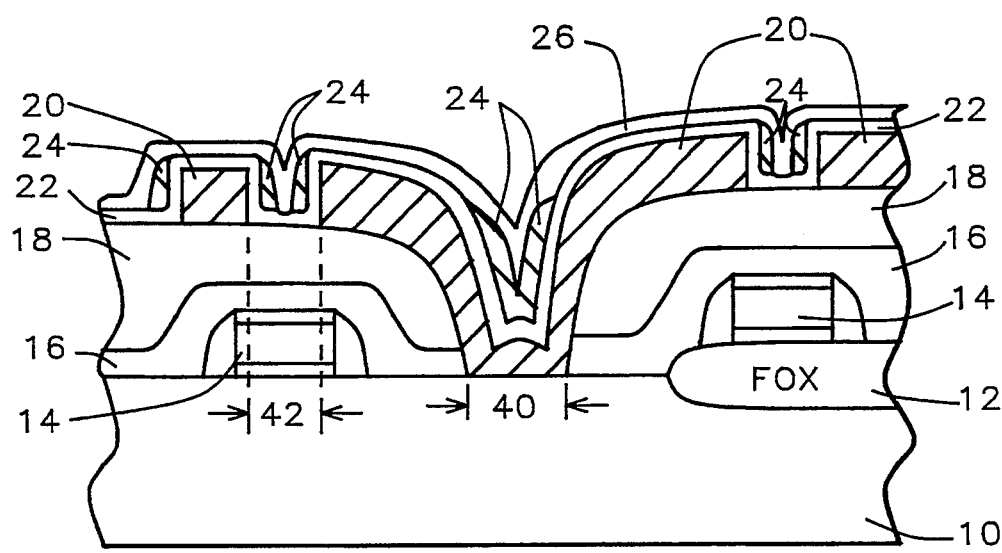

Referring now to FIG. 4, there is shown the PECVD deposition of TEOS silicon oxide layer 26. The deposition of layer 26 is achieved under the same conditions as those described above for oxide layer 22. Layer 26 has a preferred thickness of between about 2000 to 4000 Angstroms. This silicon oxide partially fills the open-spaced regions such as space 42, which is between about 0.5 to 0.9 microns in size. This layer also is required to provide the critical and desired silicon oxide thickness that will be needed for the coming spin-on-glass etchback.

For spaces larger than about 3 microns, the step coverage (defined to be the thickness of the vertical deposition divided by the thickness of the horizontal deposition upon the horizontal and vertical elements of a trench structure having a width or space dimension such as 3 microns) of the PECVD oxide is approximately 60%. For spaces less than 0.8 microns, the step coverage is less than 40%. The TEOS with $O_3$ silicon oxide will fill smaller openings than will the PECVD silicon oxide, but the quality of the $O_3$ with TEOS silicon oxide is not dense enough to block passage of gases. If $O_3$ with TEOS process is used alone to produce the insulating layer, there could be a poisoned via problem. That is, there may be outgassing of water, etc. through the insulating layer causing corrosion of the aluminum or other metal layer. The combination of the PECVD and THCVD layers, anisotropic etchback, and additional PECVD layer, described above, effectively fills the small spaces and contact holes without poisoned via problems. Such a small space is indicated by 40 and 42 in Fig. 4 and is typically less than 0.6 microns in size.

Figure 8:
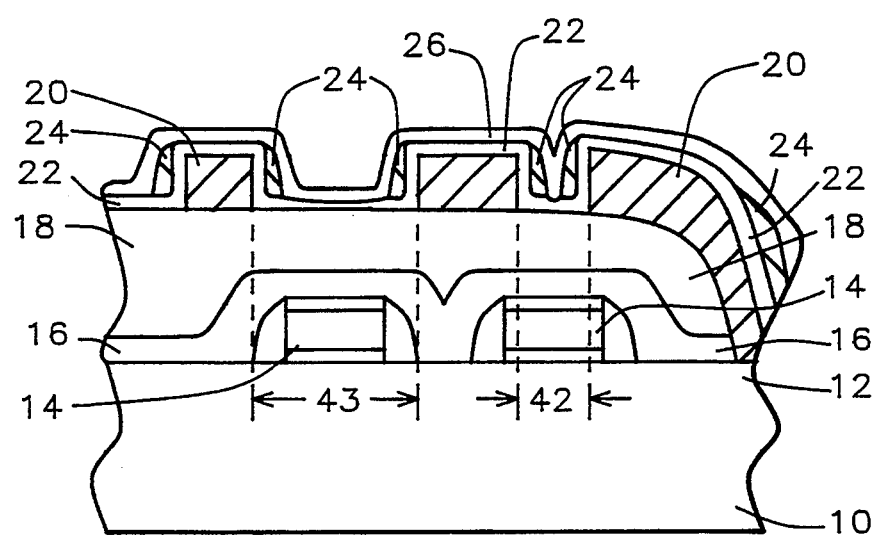

Referring now to FIG. 8, there is shown a similar cross section to that of Fig. 4. In this illustration, there is shown a wide space, indicated by 43 in FIG. 8, which is larger than 0.9 microns in size. This space is only partially filled by PECVD layers 22 and 26 and THCVD layer 24. It will be filled by the subsequent spin-on-glass deposition. The void problem with the spin-on-glass process has been eliminated by the PECVD and THCVD layers, anisotropic etchback, and additional PECVD layer.

Figure 5:
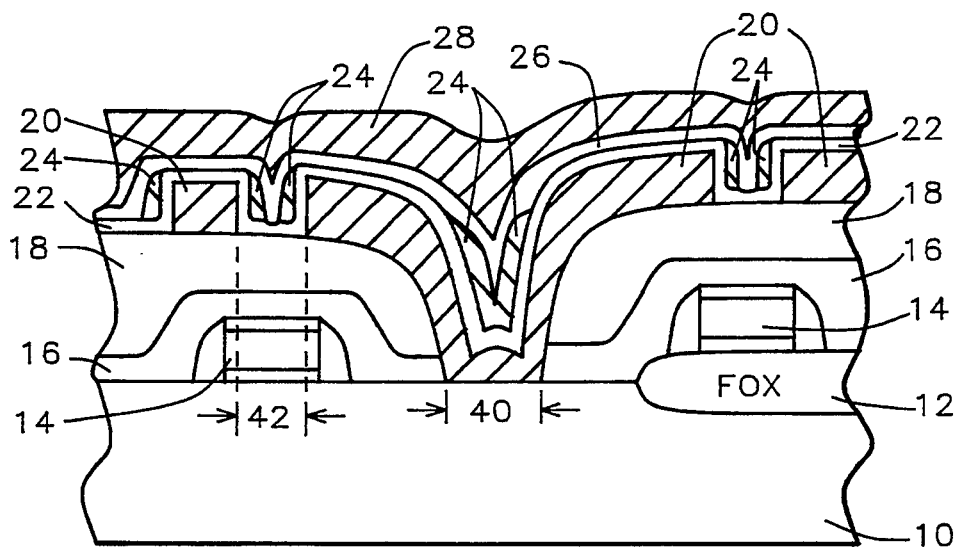

The main planarization step, the spin-on-glass coating 28, is illustrated with the aid of FIG. 5. A double coating of a siloxane, such as Allied Signal 211 is applied. Alternatively, a silicate type spin-on-glass coating could be used. The spin-on-glass material suspended in the vehicle or solvent is deposited onto the semiconductor wafer surface and uniformly spread thereover by the action of spinning the wafer, for example, at 3500 revolutions per minute. The material fills the indentations in the integrated circuit wafer surface, that is planarization.

Most of the vehicle or solvent is driven off by a low temperature baking step. The wafer is heated to for example 80°C, 150°C, and 250°C. Each heating duration is preferably one to two minutes. The total thickness of the spin-on-glass material is between about 2000 to 5000 Angstroms depending upon the particular type of spin-on-glass material, that is siloxane or silicate material that is used.

A curing step in a nitrogen or other inert atmosphere densifies as well as cures the spin-on-glass layer to a silicon oxide structure. There is a typically a stabilization time of less than about 60 minutes and preferably about 50 minutes, followed by a less than about 30 minute and preferably 15 minute ramp-up from 370° C. to 425°C. The curing step is preferably at least about 60 minutes.

Figure 6:
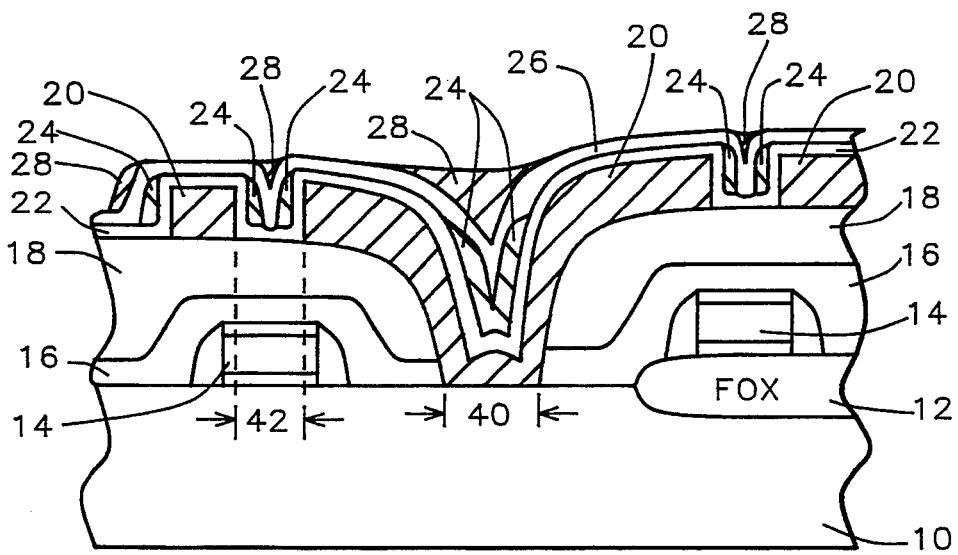

Referring now to FIG. 6, the spin-on-glass layer 28 is blanket anisotropically etched back using preferably $CF_4$ and $CHF_3$ gas at a pressure of between about 100 to 200 and preferably 150 mTorr and power of between about 200 to 300 and preferably about 250 watts with an etch stop at layer 26. This leaves the spin-on-glass material only within the contact holes and wide spaces. The selectivity between the spin-on-glass layer 28 and the PECVD layer 26 is in the range from 0.8 to 1.3.

Figure 7:
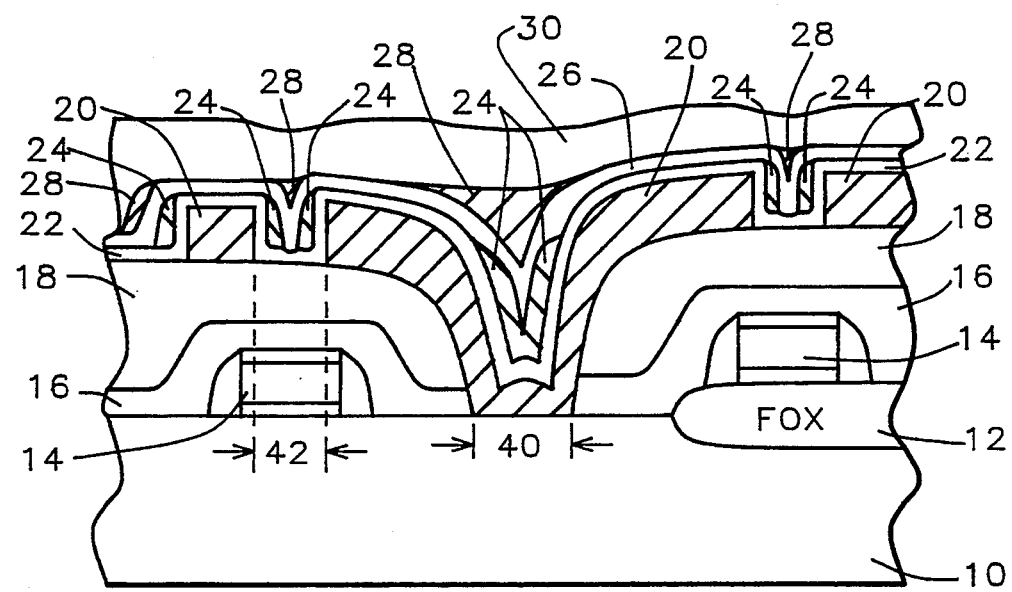

FIG. 7 illustrates the final deposition of silicon oxide layer 30 using TEOS with $O_2$ by PECVD to a thickness of between about 4000 to 8000 Angstroms. This completes the desired thickness of the inter-metal dielectric. The result of this very manufacturable method of the present invention is excellent planarity with no voids or poisoned via.

Openings (not shown) can now be formed in layers 30, 26, 22 to contact the first metallurgy layer 20. The next level of metallurgy is now deposited and patterned as is well understood by those skilled in the art.

While the invention has been particularly shown and described with reference to the preferred embodiments thereof, it will be understood by those skilled in the art that various changes in form and details may be made without departing from the spirit and scope of the invention. Particularly it should be understood that this invention is not limited to the embodiment of FIGS. 1 to 7 wherein the planarization is shown at the contact level, but is equally applicable to planarization at any of the desired levels of metallurgy.

What is claimed is:

1. The method of planarizing the dielectric layers in the trenches and holes between conductor layers that are less than about 1.0 micron in width, in submicron integrated circuits comprising:

providing semiconductor device structures in and on a semiconductor substrate;

providing at least one patterned conductive layer for contacting the active elements of said device structures;

the surface of said patterned conductive layer structure is irregular with horizontal and vertical components forming the trenches and holes;

depositing a first layer of an insulator over said irregular structure patterned conductive layer;

covering said insulator with a layer of chemically vapor deposited silicon oxide using the TEOS with ozone pyrolytic process wherein the TEOS with ozone silicon oxide layer will partially fill said horizontal and vertical components of said layer structure not filled by said insulator layer;

anisotropically etching back said TEOS with ozone silicon oxide layer thereby leaving said TEOS with ozone layer only in said horizontal and vertical components of said layer structure and retaining a positive angle;

depositing a second insulating layer over said layer structure with said TEOS with ozone layer;

covering said second insulating layer with at least one spin-on-glass layer to fill the valleys of said irregular structure and curing said spin-on-glass layer;

partially blanket anisotropically etching said spin-on-glass layer through its thickness to the underlying said second insulating layer at its highest points and leaving said spin-on-glass layer portions in said valleys, whereby said second insulating layer prevents etching of said patterned conductive layer; and depositing a top dielectric layer over said spin-on-glass layer to complete said planarizing.

2. The method of claim 1 wherein the said first insulator layer is deposited by plasma-enhanced chemical vapor deposition of TEOS and $O_2$ gas at a pressure of between about 8 to 10 Torr, a temperature of between about 380° to 400° C. in a plasma environment wherein said deposition is to a thickness of between about 1500 to 2500 Angstroms.

3. The method of claim 1 wherein the said TEOS with ozone silicon oxide is deposited by thermal chemical vapor deposition of TEOS and $O_3$ gas at a pressure of between about 55 to 65 Torr at between about 380° to 400° C. wherein said deposition is to a thickness of between about 2000 to 3000 Angstroms.

4. The method of claim 1 wherein said anisotropic partial etchback of said TEOS with ozone silicon oxide layer uses $CF_4$ gas at a pressure of between about 250 to 350 mTorr and a power of between about 250 to 500 watts and wherein the selectivity of the etchant between said first insulator layer and said TEOS with ozone layer greater than about 1.05.

5. The method of claim 1 wherein the said second insulating layer is a silicon oxide layer which is deposited by plasma-enhanced chemical vapor deposition of TEOS and $O_2$ gas at a pressure of between about 8 to 10 Torr and a temperature between about 380° to 400° C. in a plasma environment wherein said deposition is to a thickness of between about 2000 to 4000 Angstroms.

6. The method of claim 1 wherein there is one layer of said spin-on-glass which has a thickness of between about 2000 to 5000 Angstroms and said spin-on-glass material is siloxane type.

7. The method of claim 1 wherein there are two coatings of said spin-on-glass which have a combined thickness of between about 2000 to 5000 Angstroms and said spin-on-glass material is siloxane type.

8. The method of claim 1 wherein said spin-on-glass material is siloxane type and the curing conditions include stabilizing at a temperature between about 320° to 370° C. for less than 60 minutes, then ramping up to a temperature of between about 410° to 450° C. in less than about 30 minutes and curing at a temperature of between about 410° to 450° C. for between about 30 to 90 minutes.

9. The method of claim 1 wherein said anisotropic partial etchback of said spin-on-glass layer uses $CF_4$ and $CH_3$ gases at a pressure of between about 100 to 200 mTorr and power of between about 200 to 350 watts and wherein the selectivity between said spin-on-glass layer and said second insulating layer is in the range from 0.8 to 1.3.

10. The method of planarizing the surfaces of a submicron integrated circuit without the incorporation of voids in the trenches and holes, formed by patterning a conductive layer, comprising:

providing an insulator layer over said conductive layer which connects devices within said integrated circuit wherein there are substantial surface irregularities including the trenches and holes;

covering said insulator with a layer of chemically vapor deposited silicon oxide using the TEOS with ozone pyrolytic process wherein the TEOS with ozone silicon oxide layer will partially fill said surface irregularities not filled by said insulator layer;

anisotropically etching back said TEOS with ozone silicon oxide layer thereby leaving said TEOS with ozone layer only in said surface irregularities and retaining a positive angle;

depositing a second insulating layer over said layer structure with said TEOS with ozone layer;

covering said second insulating layer with at least one spin-on-glass layer to fill the valleys of said irregular structure and curing said spin-on-glass layer;

partially blanket anisotropically etching said spin-on-glass layer through its thickness to underlying second insulating layer at its highest points and leaving said spin-on-glass layer portions in said valleys, whereby said second insulating layer prevents etching of said patterned conductive layer; and depositing a top dielectric layer over said spin-on-glass layer to complete said planarization.

11. The method of claim 10 wherein the said first insulator layer is deposited by plasma-enhanced chemical vapor deposition of TEOS and $O_2$ gas at a pressure of between about 8 to 10 Torr, a temperature of between about 380° to 400° C. in a plasma environment wherein said deposition is to a thickness of between about 1500 to 2500 Angstroms.

12. The method of claim 10 wherein the said TEOS with ozone silicon oxide is deposited by thermal chemical vapor deposition of TEOS and $O_3$ gas at a pressure of between about 55 to 65 Torr at between about 380° to 400° C. wherein said deposition is to a thickness of between about 2000 to 3000 Angstroms.

13. The method of claim 10 wherein said anisotropic partial etchback of TEOS with ozone silicon oxide layer uses $CF_4$ gas at a pressure of between about 250 to 350 mTorr and a power of between about 250 to 500 watts and wherein the selectivity between said first insulator layer and said TEOS with ozone layer is greater than about 1.05.

14. The method of claim 10 wherein the said second insulating layer is a silicon oxide layer which is deposited by plasma-enhanced chemical vapor deposition of TEOS and $O_2$ gas at a pressure of between about 8 to 10 Torr and a temperature of between about 380° to 400° in a plasma environment wherein said deposition is to a thickness of between about 2000 to 4000 Angstroms.

15. The method of claim 10 wherein there is one layer of said spin-on-glass which has a thickness of between about 2000 to 5000 Angstroms and said spin-on-glass material is siloxane type.

16. The method of claim 10 wherein there are two coatings of said spin-on-glass which have a combined thickness of between about 2000 to 5000 Angstroms and said spin-on-glass material is siloxane type.

17. The method of claim 10 wherein said spin-on-glass material is siloxane type and the curing conditions include stabilizing at a temperature between about 320° to 370° C. for less than 60 minutes, then ramping up to a temperature of between about 410° to 450° C. in less than about 30 minutes and curing at a temperature of between about 410° to 450° C. for between about 30 to 90 minutes.

18. The method of claim 10 wherein said anisotropic partial etchback of said spin-on-glass layer uses $CF_4$ and $CHF_3$ gases at a pressure of between about 100 to 200 mTorr and power of between about 200 to 350 watts and wherein the selectivity between said spin-on-glass layer and said second insulating layer is in the range from 0.8 to 1.3.

19. The method of claim 1 wherein said horizontal and vertical components of said conductive layer have a width of between about 0.5 and 0.9 microns.

20. The method of claim 10 wherein said substantial surface irregularities have a width of between about 0.5 and 0.9 microns.

* * * * *